(12) United States Patent
Baptist et al.

(10) Patent No.: US 10,904,337 B2
(45) Date of Patent: *Jan. 26, 2021

(54) ZONE STORAGE—RESILIENT AND EFFICIENT STORAGE TRANSACTIONS

(71) Applicant: International Business Machines Corporation, Armonk, NY (US)

(72) Inventors: Andrew D. Baptist, Mt. Pleasant, WI (US); Greg R. Dhuse, Chicago, IL (US); Ravi V. Khadiwala, Bartlett, IL (US); Manish Motwani, Chicago, IL (US); Praveen Viraraghavan, Chicago, IL (US); Ilya Volvovski, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/455,993

(22) Filed: Jun. 28, 2019

(65) Prior Publication Data

US 2019/0320023 A1    Oct. 17, 2019

Related U.S. Application Data

(63) Continuation of application No. 15/437,048, filed on Feb. 20, 2017, now Pat. No. 10,382,553.

(51) Int. Cl.
*H04L 29/08* (2006.01)
*G06F 12/0802* (2016.01)
(Continued)

(52) U.S. Cl.
CPC ........ *H04L 67/1097* (2013.01); *G06F 3/0604* (2013.01); *G06F 3/065* (2013.01);
(Continued)

(58) Field of Classification Search
CPC ........ G06F 3/067; G06F 3/0619; G06F 3/064; G06F 3/0644; G06F 3/0604;
(Continued)

(56) References Cited

U.S. PATENT DOCUMENTS

| 4,092,732 A | 5/1978 | Ouchi |
| 5,454,101 A | 9/1995 | Mackay et al. |

(Continued)

OTHER PUBLICATIONS

Chung; An Automatic Data Segmentation Method for 3D Measured Data Points; National Taiwan University; pp. 1-8; 1998.
(Continued)

*Primary Examiner* — Ruolei Zong
(74) *Attorney, Agent, or Firm* — James Nock; Andrew D. Wright; Roberts Calderon Safran & Cole, P.C.

(57) ABSTRACT

A distributed storage network (DSN) includes a DSN memory and a distributed storage (DS) processing unit. The DS processing unit determines a particular revision of source data for persistence, and generates a protocol message associated with the particular revision of source data. The protocol message is generated based on a balance between durability and persistence associated with the particular revision. The protocol message is transmitted from the DS processing unit to the DSN memory, and indicates to the DSN memory a particular persistence protocol. The DSN memory process data slices corresponding to the particular revision of source data in accordance with the particular persistence protocol.

20 Claims, 6 Drawing Sheets

(51) Int. Cl.
*G06F 3/08* (2006.01)
*G06F 3/06* (2006.01)
*G06F 11/10* (2006.01)
*H03M 13/15* (2006.01)
*H03M 13/00* (2006.01)

(52) U.S. Cl.
CPC ............ *G06F 3/067* (2013.01); *G06F 3/0619* (2013.01); *G06F 3/0644* (2013.01); *G06F 11/1076* (2013.01); *G06F 12/0802* (2013.01); *G06F 2212/60* (2013.01); *H03M 13/1515* (2013.01); *H03M 13/616* (2013.01)

(58) Field of Classification Search
CPC ............ G06F 12/0802; G06F 12/0813; G06F 2212/60; H04L 67/1097; H04L 67/1095; H03M 13/1515; H03M 13/616
USPC ........................................................ 709/217
See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 7,653,628 B2 | 1/2010 | Manolov et al. | |
| 8,832,234 B1* | 9/2014 | Brooker ................ | G06F 16/182 709/219 |
| 8,918,392 B1* | 12/2014 | Brooker ............ | H04L 29/06047 707/736 |
| 9,152,505 B1* | 10/2015 | Brooker .............. | G06F 11/1456 |
| 10,382,553 B2 | 8/2019 | Baptist et al. | |
| 2002/0062422 A1 | 5/2002 | Butterworth et al. | |
| 2002/0143798 A1* | 10/2002 | Lisiecki ............. | H04L 67/1008 |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2014/0351624 A1* | 11/2014 | Resch ............... | H04W 12/0023 714/6.2 |
| 2015/0088820 A1 | 3/2015 | Barabas et al. | |
| 2015/0142737 A1* | 5/2015 | Behuria ................ | G06F 16/273 707/613 |
| 2017/0004055 A1* | 1/2017 | Horan ................. | H04L 65/4076 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

(56) References Cited

OTHER PUBLICATIONS

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

List of IBM Patents or Patent Applications Treated as Related, dated Aug. 17, 2020, 1 page.

* cited by examiner

ZONE STORAGE—RESILIENT AND EFFICIENT STORAGE TRANSACTIONS

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Some conventional systems place data locks on new data, which prevent access to the data until after a write to persistent storage has been completed. This technique can adversely impact storage performance. Other systems attempt to optimize storage performance through the use of cache memories. However, use of cache memories can reduce data durability, for example in the case of a power failure. These two types of conventional systems have, to date, been mutually exclusive.

DETAILED DESCRIPTION OF THE INVENTION

Figure 1:
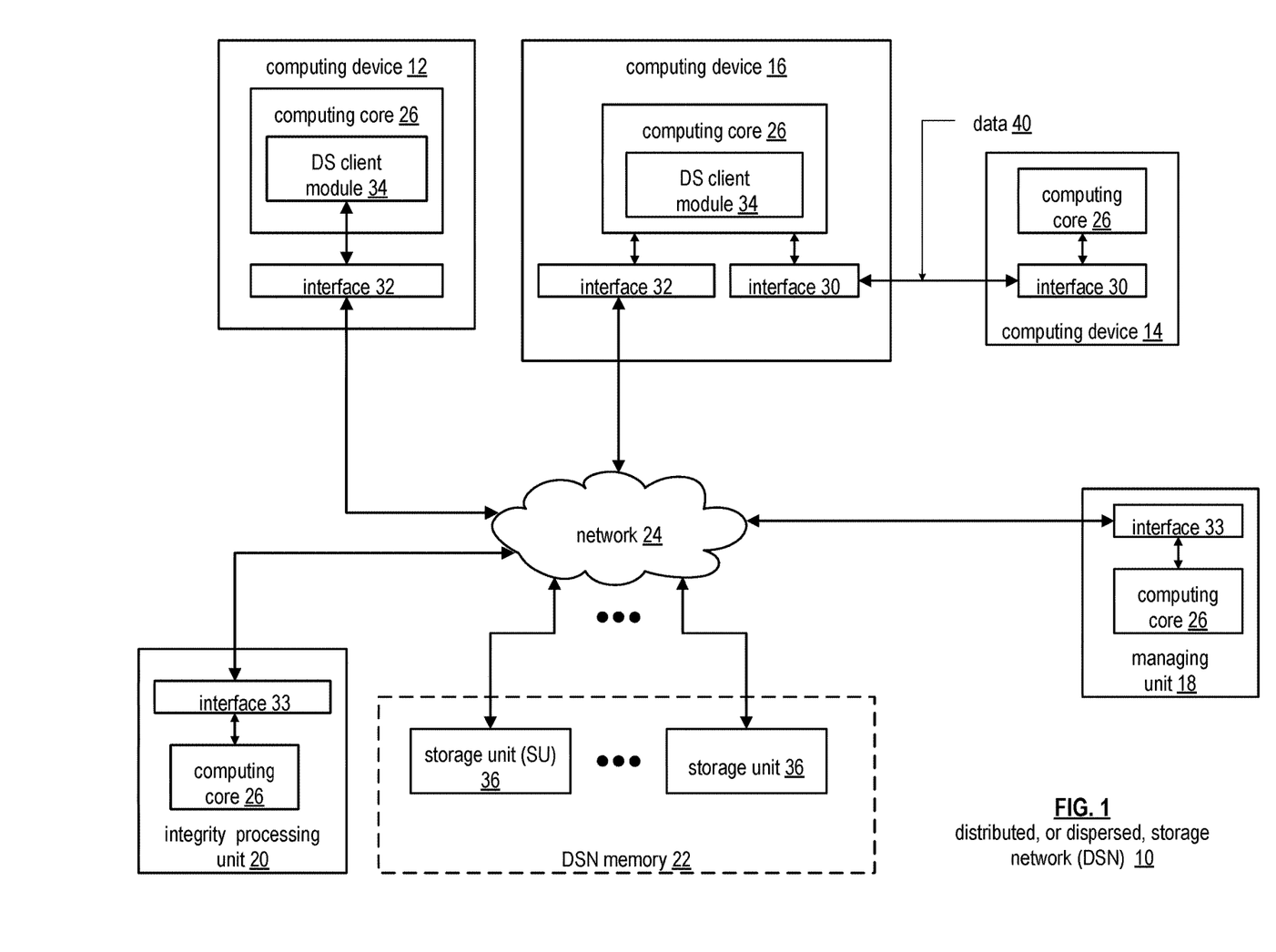
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
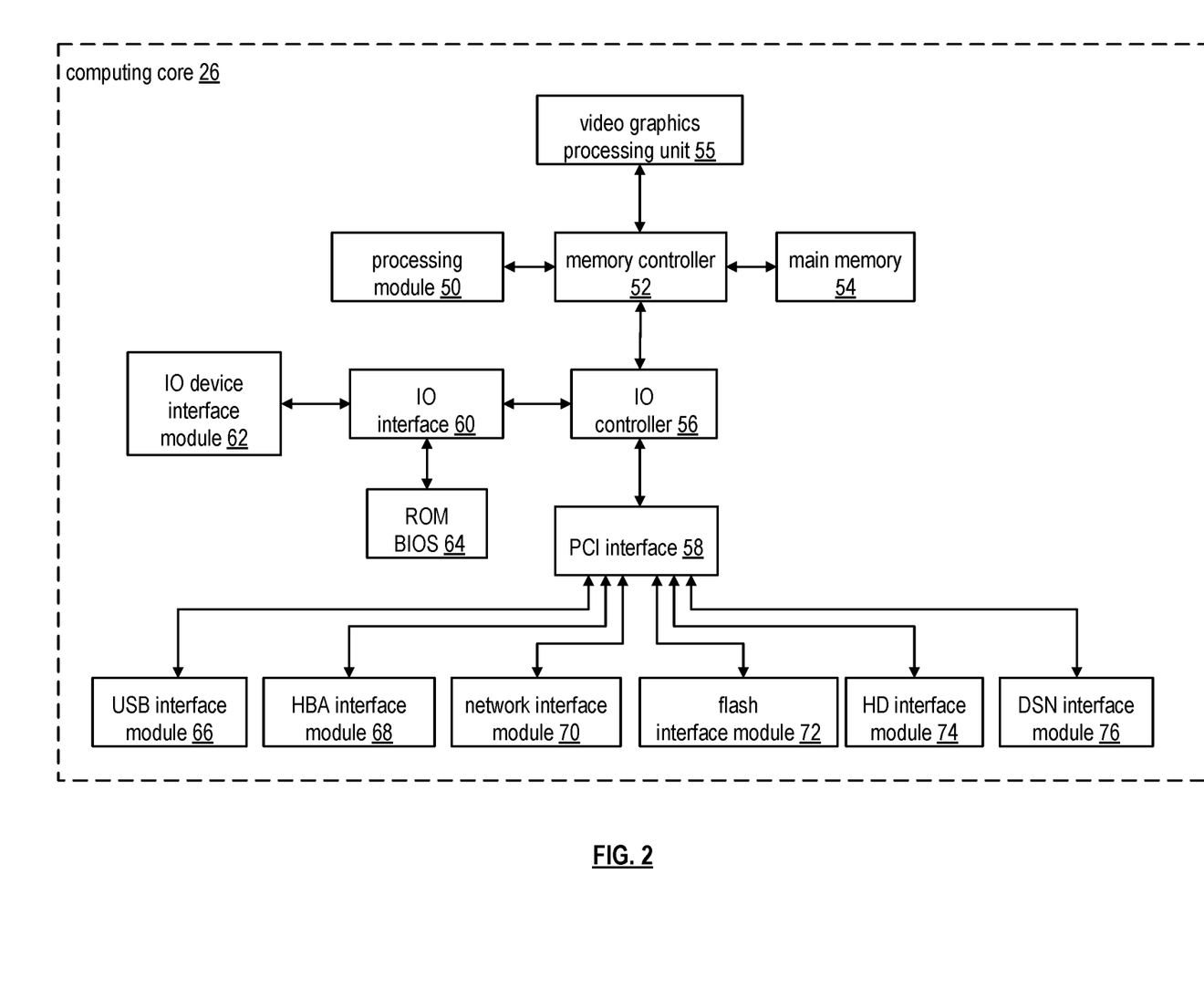
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figures 3, 4:
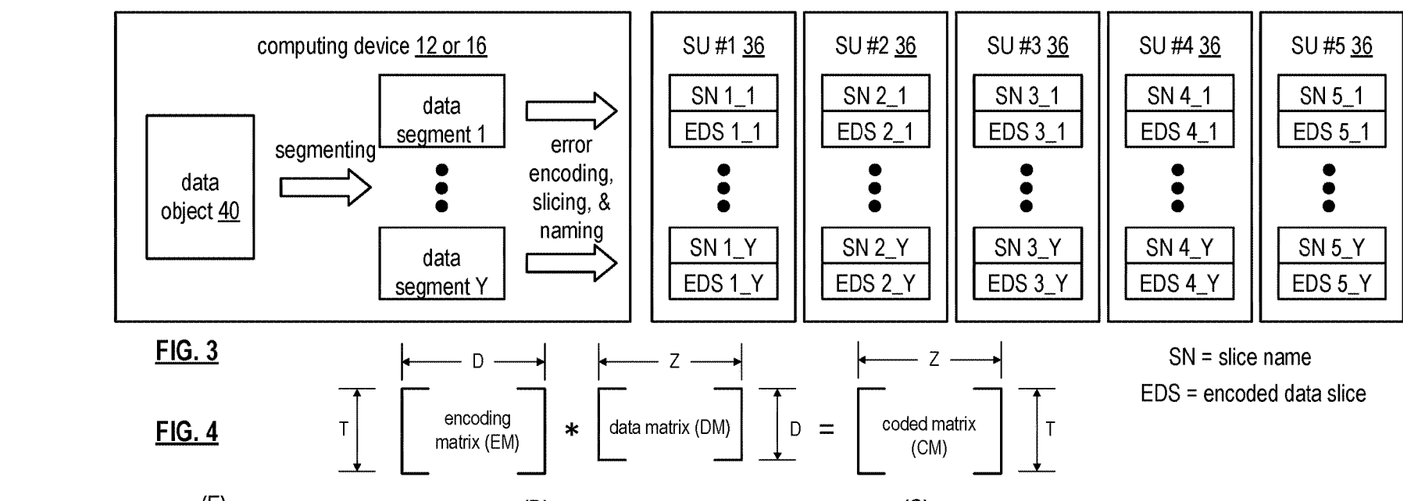
FIG. 3 is a schematic block diagram of an example of dispersed storage error encoding of data in accordance with the present invention.
FIG. 4 is a schematic block diagram of a generic example of an error encoding function in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figure 5:
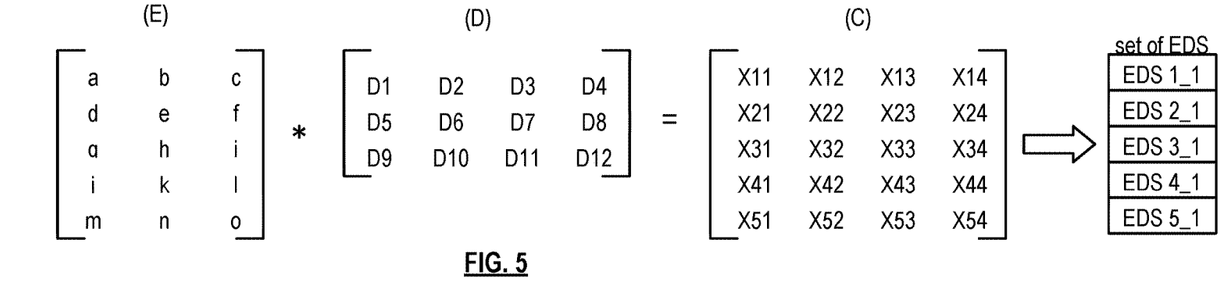
FIG. 5 is a schematic block diagram of a specific example of an error encoding function in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
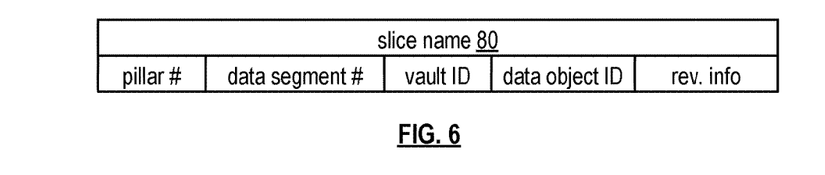
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
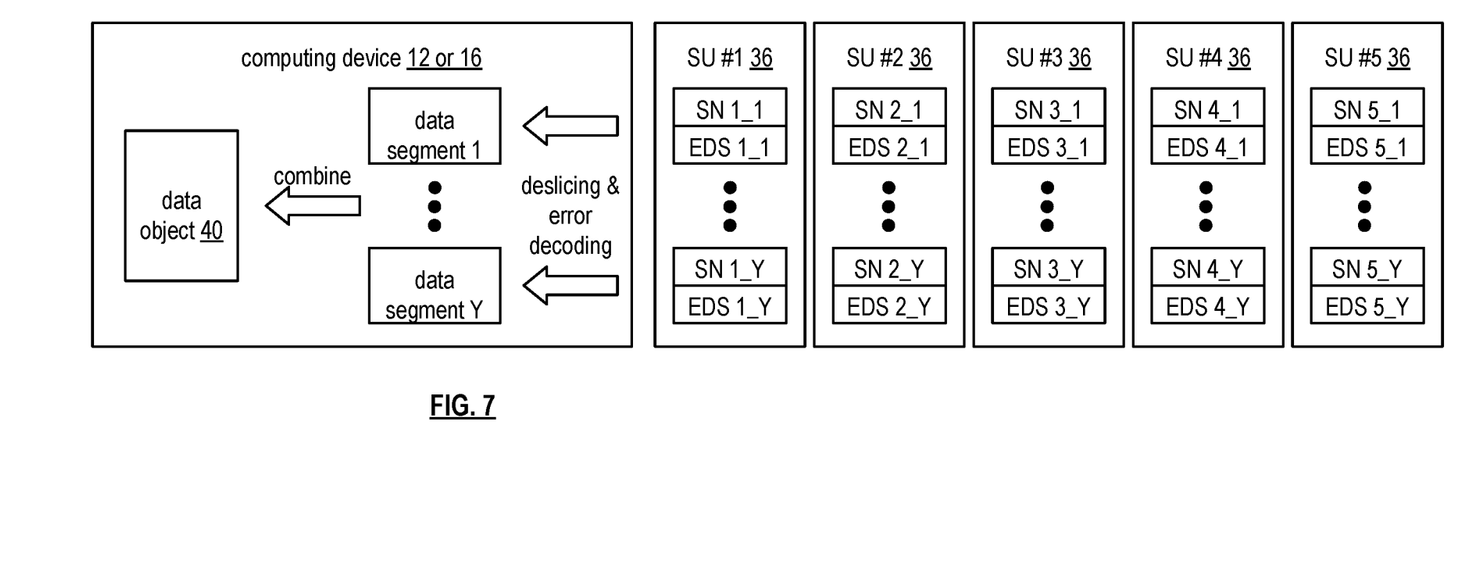
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
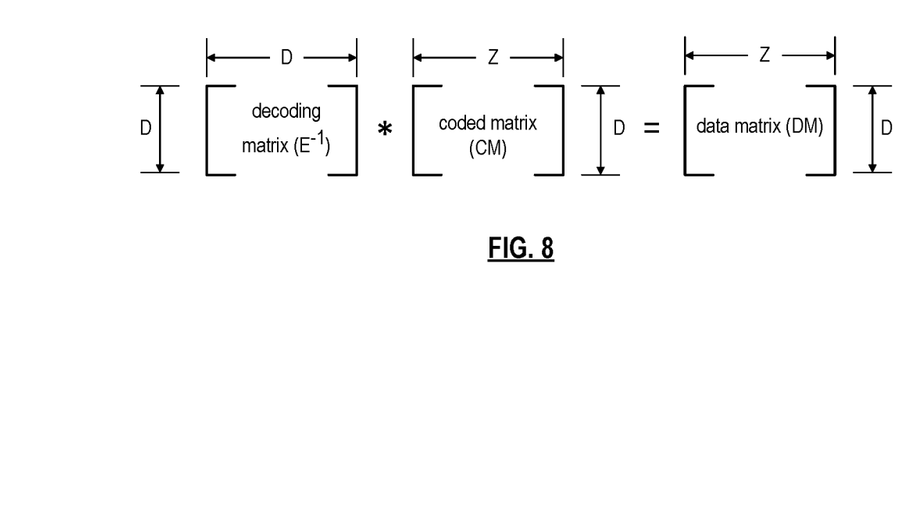
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
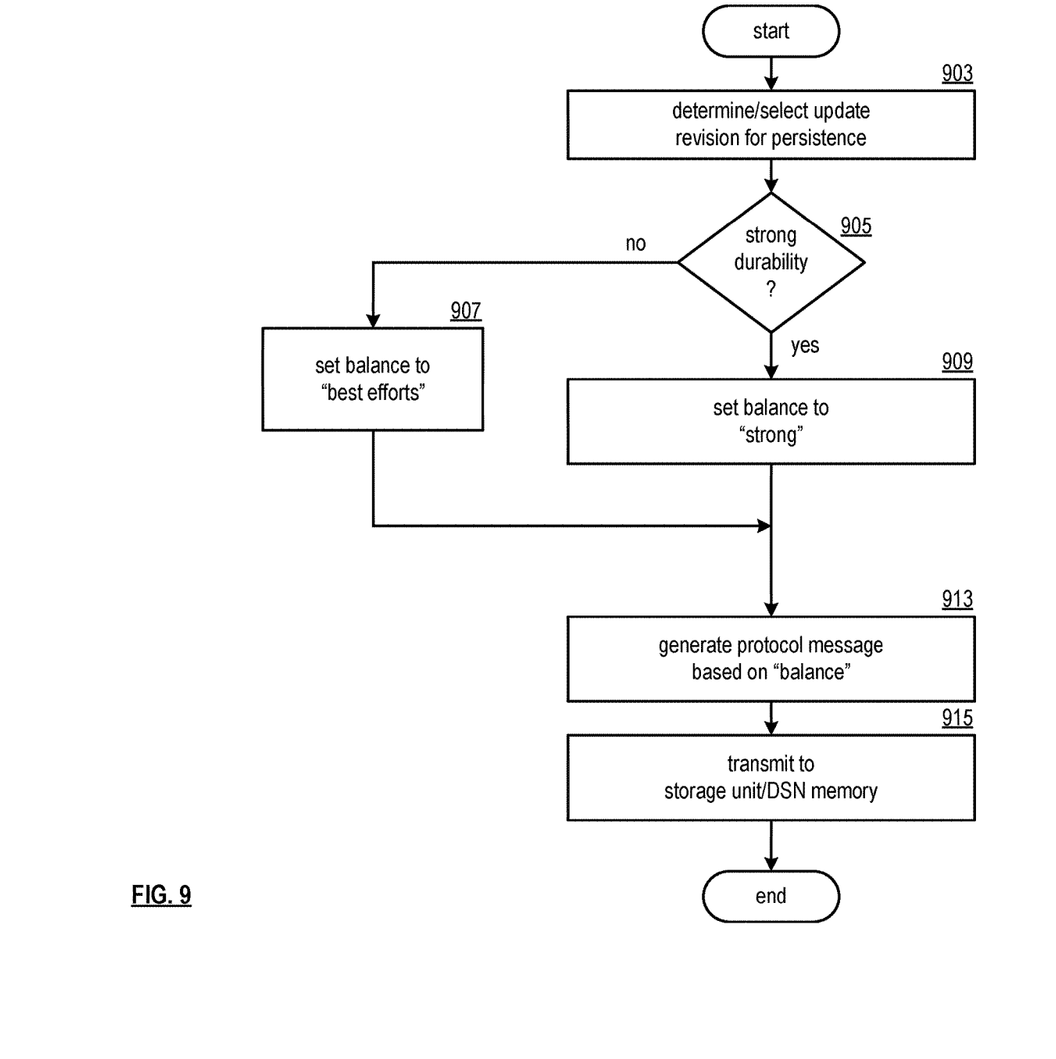
FIG. 9 is a flow diagram of an embodiment of a method for use in a distributed storage (DS) processing unit that balances data durability and storage performance in a DSN in accordance with the present invention.
Figure 10:
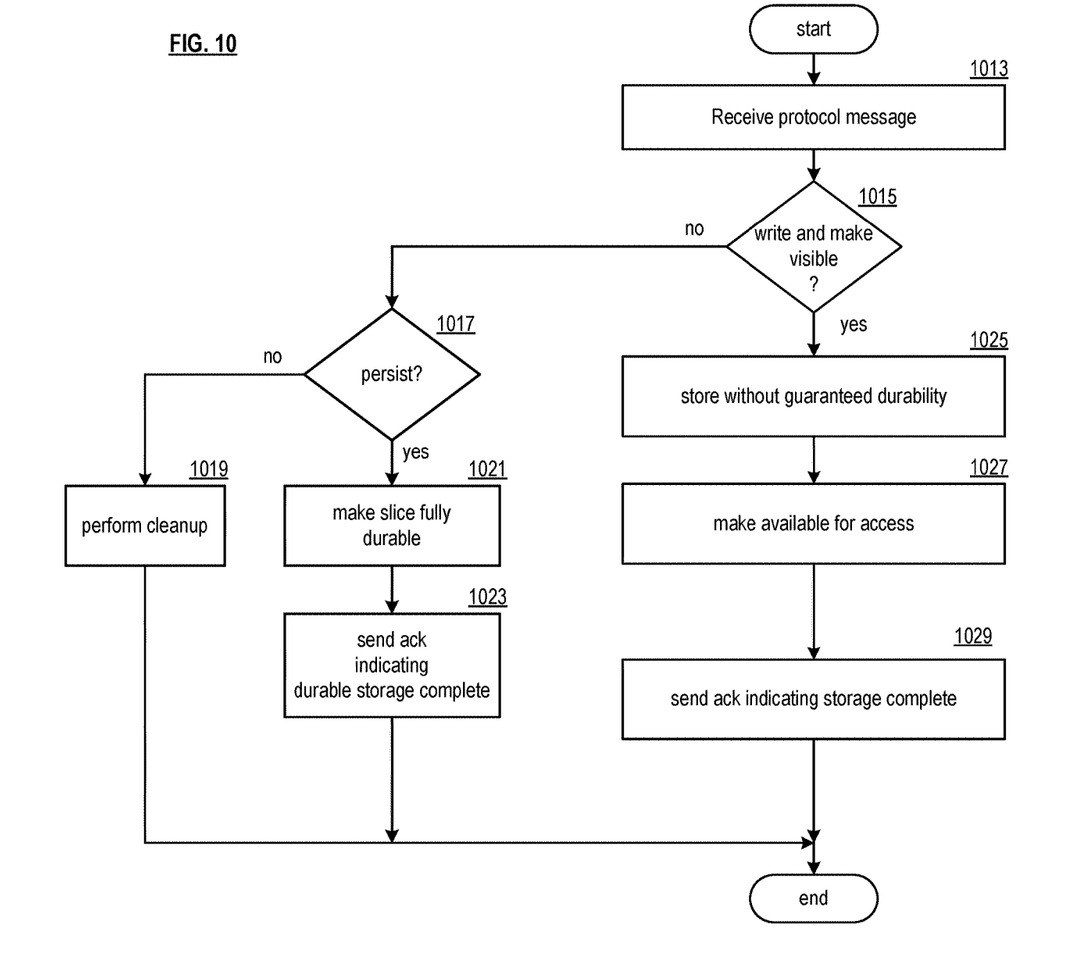
FIG. 10 is a flow diagram of an embodiment of a method for use in a DSN memory that balances data durability and storage performance in a DSN in accordance with the present invention.

Referring next to FIGS. 9 and 10, various embodiments of zone storage, which can provide resilient and efficient storage transactions are discussed. In various embodiments, a distributed storage (DS) unit, or a distributed storage network (DSN) memory including multiple DS units, seeks to execute a distributed storage protocol while simultaneously maximizing data durability and optimizing storage performance. Note that durability and performance can be balanced for a single DS unit, also referred to herein as a storage unit, or across multiple DS units included in a DSN memory. Various implementations described herein use a persistence protocol to balance durability and performance with strong guarantees.

In at least one embodiment, the persistence protocol includes 3 logical phases: 1) decide which update revision should be persisted; 2) notify DS units of the winning update; and 3) Remove old revisions of the updated source. Strict storage semantics can be defined for the DS unit to follow when a protocol message is received from a DS processing unit.

The first logical phase can be initiated by a first type of protocol message: WriteAndMakeVisible, which can include a VersionedDataSlice. The VersionedDataSlice can include a slice name, data, and a revision identifier. In response to receiving this first type of protocol message, a DS unit can store the provided data slice, and make that data slice visible to subsequent requests without any guarantee of durability. For example, in one implementation, the DS unit may cache the written slice in memory. In another implementation, the DS unit may write to a fast persistent storage device. After the first phase, the DS processing unit can acknowledge success for operations that do not require strong durability of recent writes.

The second logical phase can be initiated by a second type of protocol message: "Persist," which can include a VersionedSliceName. The VersionedSliceName can include a slice name and a revision identifier of data already stored without a guarantee of durability. In response to receiving this second type of protocol message, a DS unit can make the written slice fully durable. Additionally, any updates from first phase, besides the revision specified in the protocol message, are considered to have lost a contest for persistence, and can be removed. In one embodiment, the DS unit may write and immediately flush a data slice identified in the protocol message to persistent storage. In another, the DS unit may write to storage through a cache, but waits until the data has been flushed before acknowledging completion of the request. After the second phase has been completed, the DS processing unit can acknowledge success for operations that require strong durability of recent writes.

The third logical phase can be initiated by a third type of protocol message: "Cleanup," which can include a VersionedSliceName. The VersionedSliceName can include a slice name and a revision identifier of data already stored without a guarantee of durability. In response to receiving the third type of protocol message, the DS unit removes old revisions of the written source data and cleans up any temporary transaction bookkeeping. In various implementations, old revisions are removed only after an updated revision has been fully persisted to durable storage, which can provide a strong guarantee that only recently written data can be lost in the case of power failure.

Clients of the DSN memory can choose to request strong durability for recently written data and wait until the second phase is complete, or opt for best-effort durability, and receive an indication of success after the first phase. In the case of multiple contending writers, some updates in the first phase may lose and be removed instead of persisted in the second phase. If the DS unit chooses to cache written data in memory, these updates do not consume persistent storage resources, providing a performance optimization.

Referring next to FIG. 9 a method for use in a distributed storage (DS) processing unit that balances data durability and storage performance in a DSN will be discussed in accordance with various embodiments of the present disclosure. As illustrated at block 903, a particular revision of source data is selected for persistence by a DS processing unit, for example computing device 16 of FIG. 1. For example, assume that a particular source data has been encoded into multiple distributed encoded data slices and is currently stored in DSN memory 22 of FIG. 1, using one or more DS units, such as storage units 36 of FIG. 1. A DS processing unit creates or receives revised data slices corresponding to multiple different revisions of the stored source data, and determines that the revised data slices are to be stored in one or more storage units of DSN memory 22. Before sending the revised data slices to the DSN memory for storage, the DS processing unit can select one of the revised data slices to be persisted. Determining which of the revised data slices is to be persisted can be based on a version number of the revised data slices, an order in which the revised data slices were created, a source of the revised data slices, a number of pending revisions to the currently stored source data, a priority of the revised data slices, or the like. The determination regarding persistence can be applied on a per-data slice basis, on a per-source-data basis, on a per-pillar basis, on a per-destination basis, or otherwise.

As illustrated by block 905, the DS processing unit determines whether the update revision selected for persistence is to be stored using a strong durability, as illustrated at block 905. The determination regarding whether or not the update revision will be stored using a strong durability process can be made based on one or more of a predetermination, user data associated with the source data, network load, or time since last persistence. If the determination at block 905 indicates that the selected update revision does not require strong durability, the DS processing unit sets the balance between durability and persistence to "best efforts, as illustrated by block 907. If strong durability is determined at block 905, the balance between durability and persistence is set to "strong" durability, as illustrated by block 909.

As used herein the term "strong durability" refers, generally, to a requirement that a data write operation is not considered to be completed until the data, for example a dispersed encoded data slice, is stored in a persistent memory. In various embodiments, data to be written using strong durability is not available for read operations until after the data is stored in a persistent memory. Thus, for example, in at least one embodiment a strong durability write operation is not considered complete if the data is only stored in a volatile memory or cache. The term "best efforts" refers, generally, to a write operation that can be considered complete even if written to cache or volatile memory.

As illustrated by block 913, a protocol message is generated by the DS processing unit based on the balance between durability and persistence associated with the particular revision. The protocol message can be, for example, a first type of protocol message that instructs a DSN memory or DS unit to store the particular revision, and make the revision of the source data, for example a revised encoded data slice, available to be read without a guarantee that revision is persistent. Thus, in an example of a "best efforts" balance, a revised data slice can be stored in a cache, and read out of the cache prior to being stored in a persistent memory. In this way, when access to the data is considered to be more critical than data persistence in the short term, DSN efficiency can be improved. By contrast, in an example of a "strong durability" balance, access to a revised data slice can be prevented, even if already stored in a cache, until the data has been copied or flushed to persistent storage.

The protocol message generated at block 913 can include, for example, instructions for the DSN memory to "WriteAndMakeVisible," instructions to "Persist," or instructions to "Cleanup." In at least one embodiment, a protocol message including instructions to "WriteAndMakeVisible" can be used to instruct a DSN memory to allow a data revision to be stored and accessed from a cache memory until the DSN memory has sufficient time and resources to persist the data in a persistent memory. In some embodiments, a protocol message to "Persist" instructs the DSN memory to make a revision fully durable, for example by storing the revision to a persistent memory, and to prevent access to the data until persistent storage has been completed. A protocol message instructing "Cleanup," can identify the revision selected for persistence, and cause a DSN memory to remove previously stored versions of the source data, other than the particular revision of source data, and clean up temporary transactions.

As illustrated at block 915, the DS processing unit transmits the protocol message to the DSN memory or DS unit, which process data slices corresponding to the revision of source data in accordance with the particular persistence protocol. That is to say if the persistence protocol indicated by the protocol message requires a strong durability protocol, the DSN memory will store the data slice indicated in the protocol message in persistent storage before considering a data write to have been completed. Similarly, if the persistence protocol indicates "best efforts," with regard to durability, the DSN memory can complete the write request by storing the revision in a cache, even if the revision is scheduled to be later stored in a persistent memory.

Referring next to FIG. 10 a method for use in a DSN memory that balances data durability and storage performance in a DSN will be discussed in accordance with an embodiment of the present disclosure. As illustrated at block 1013, the protocol message transmitted by the DS processing unit at block 915 of FIG. 9 is received by a DSN memory 22 (FIG. 1) or storage unit 36 (FIG. 1). The protocol message can include slice information about a dispersal encoded data slice associated with a particular revision of a data source, where the slice is to be stored by the DSN memory or DS unit. The slice information can include versioned slice data, e.g. a slicename, data, and a revision identifier), or a versioned slice name, e.g. a slice name and a revision identifier.

The DSN memory processes the protocol message to determine which type of protocol of protocol is to be implemented for the data slice. For example, at block 1015, the DSN memory determines whether the type of protocol message is a "best efforts" protocol message, such as a WriteAndMakeVisible message, which allows the DSN memory to provide access to the data slice even before the data slice is stored in a persistent memory. As illustrated at block 1017, if the protocol message type is not "best efforts," a check is made to determine if the protocol message is a "strong durability" type, indicating that persistent storage is required prior to a write action being considered complete.

As illustrated by block 1019, if the message type is neither "best efforts" nor "strong durability," message cleanup is performed for the slice identified in the protocol message, or in some cases for all slices of the source data being stored by the DSN memory. Message cleanup can include flushing a particular revision stored using "best efforts" to persistent memory, removing or deleting any cached revisions other than the identified version, and finalizing or removing any temporary transaction bookkeeping associated with the identified slice.

As illustrated by block 1021, if the protocol message is a "strong durability" type message, the DSN memory makes the slice identified in the protocol message fully durable. The slice identified can be a slice previously stored in a non-persistent memory, a slice transmitted to the DSN memory in a separate message, or a slice included in the protocol message itself. Making the slice fully durable can include: copying, moving or flushing from cache a slice or slices previously stored in a non-persistent memory to a persistent memory; storing a newly received slice or slices into a persistent memory; or storing slice data included in the protocol message to a persistent memory, such as a memory not subject to loss of data due to power loss.

As illustrated by block 1023, the DSN memory or DS unit can send an acknowledgment message to the DS processing unit indicating that steps needed to implement "strong durability" have been completed. These steps can include writing a revised data slice to a persistent storage medium. In at least one embodiment, the "strong durability" protocol is not considered to be complete until the data has actually been stored in a persistent state in the persistent memory. Thus, in some embodiments the protocol is incomplete, and access to the data slice can be prevented, even if the data slice has been written to a cache in the persistent memory device. In various embodiments, the acknowledgement will be sent only after the data slice is safely stored in a persistent memory, not subject to data loss due to a power failure, not subject to loss due to hardware connectivity issues, or the like.

As illustrated at block 1025, in contrast to a "strong durability" protocol, a "best efforts" protocol can instruct the DSN memory to store the revised data slice indicated by the protocol message in a cache or other non-persistent storage. As illustrated by block 1027, the DSN memory makes the revised data slice available for access, even though the revised data slice has not yet been stored in a persistent memory. Similarly, as illustrated at block 1029, the DSN sends and acknowledgement message to the DS processing unit indicating that the "best efforts" protocol has been completed, even though the revised data slice has not yet been stored in a persistent memory.

In various embodiments, a single protocol message can provide instructions to the DSN memory about how to process all revised data slices associated with particular source data. Thus, all revisions for one source file (encoded into multiple slices) can be processed using a "best efforts" protocol, while all revisions for another source file can be processed using a "strong durability" protocol. In other implementations a DS processing unit sends a protocol message for each data slice revision, so that some revisions for a single source file can be processed using a "best efforts" protocol, while other revisions for that same source file can be processed using a "strong durability" protocol.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal A has a greater magnitude than signal B, a favorable comparison may be achieved when the magnitude of signal A is greater than that of signal B or when the magnitude of signal B is less than that of signal A. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use in a distributed storage network (DSN) including a DSN memory and a distributed storage (DS) processing unit, the method comprising:
   receiving, at the DSN memory, a protocol message transmitted by the DS processing unit, the protocol message indicating a particular persistence protocol to be applied to a particular revision of source data, wherein the particular persistence protocol is selected from among of a plurality of different persistence protocols implementing different balances between durability and persistence;
   obtaining, at the DSN memory, write data having the particular revision of source data indicated by the protocol message; and
   storing the write data using the particular persistence protocol as indicated by the protocol message.

2. The method of claim 1, wherein the particular persistence protocol includes:
   information instructing the DSN memory to make the particular revision of source data visible to subsequent requests without guaranteeing persistence of the particular revision of source data.

3. The method of claim 1, wherein the protocol message includes:
   a dispersal encoded data slice associated with the particular revision of source data.

4. The method of claim 1, wherein the particular persistence protocol includes:
   information instructing the DSN memory to make the particular revision of source data fully durable.

5. The method of claim 4, wherein the protocol message includes:
   a versioned slice name of a dispersal encoded data slice associated with the particular revision of source data; and
   information instructing the DSN memory to transmit an acknowledgement message to the DS processing unit indicating that the particular revision of source data has been flushed to persistent storage.

6. The method of claim 5, wherein the protocol message further includes:
   information instructing the DSN memory to remove data slices associated with other revisions of the source data, wherein the other revisions have been stored in a cache memory.

7. The method of claim 1, wherein the particular persistence protocol includes:
   information instructing the DSN memory to:
      remove previously stored versions of the source data, other than the particular revision of source data; and
      clean up temporary transactions related to the particular revision of source data.

8. A distributed storage network (DSN) memory comprising:
   a processor;
   memory operably associated with the processor;
   a program of instructions configured to be stored in the memory and executed by the processor, the program of instructions including:
      at least one instruction to receive, at the DSN memory, a protocol message transmitted by a distributed storage (DS) processing unit, the protocol message indicating a particular persistence protocol to be applied to a particular revision of source data, wherein the particular persistence protocol is selected from among of a plurality of different persistence protocols implementing different balances between durability and persistence;
      at least one instruction to obtain, at the DSN memory, write data having the particular revision of source data indicated by the protocol message; and
      at least one instruction to store the write data using the particular persistence protocol as indicated by the protocol message.

9. The DSN memory of claim 8, wherein the particular persistence protocol includes:
   information instructing the DSN memory to make the particular revision of source data visible to subsequent requests without guaranteeing persistence of the particular revision of source data.

10. The DSN memory of claim 8, wherein the protocol message includes:
    a dispersal encoded data slice associated with the particular revision of source data.

11. The DSN memory of claim 8, wherein the particular persistence protocol includes:
    information instructing the DSN memory to make the particular revision of source data fully durable.

12. The DSN memory of claim 11, wherein the protocol message includes:
    a versioned slice name of a dispersal encoded data slice associated with the particular revision of source data; and
    information instructing the DSN memory to transmit an acknowledgement message to the DS processing unit indicating that the particular revision of source data has been flushed to persistent storage.

13. The DSN memory of claim 12, wherein the protocol message further includes:
    information instructing the DSN memory to remove data slices associated with other revisions of the source data, wherein the other revisions have been stored in a cache memory.

14. The DSN memory of claim 8, wherein the particular persistence protocol includes:
    information instructing the DSN memory to:
       remove previously stored versions of the source data, other than the particular revision of source data; and
       clean up temporary transactions related to the particular revision of source data.

15. A distributed storage network (DSN) comprising:
- a DSN memory including a plurality of storage units and a first computing core;
- a distributed storage (DS) processing unit coupled to the DSN memory via a communications network, and configured transmit, to the DSN memory, a protocol message indicating a particular persistence protocol to be applied to a particular revision of source data, wherein the particular persistence protocol is selected from among of a plurality of different persistence protocols implementing different balances between durability and persistence;
- the DSN memory configured to:
  - receive the protocol message;
  - obtain write data having the particular revision of source data indicated by the protocol message; and
  - store the write data using the particular persistence protocol as indicated by the protocol message.

16. The DSN of claim 15, wherein the particular persistence protocol includes:
- information instructing the DSN memory to make the particular revision of source data visible to subsequent requests without guaranteeing persistence of the particular revision of source data.

17. The DSN of claim 15, wherein the protocol message includes:
- a dispersal encoded data slice associated with the particular revision of source data.

18. The DSN of claim 15, wherein the particular persistence protocol includes:
- information instructing the DSN memory to make the particular revision of source data fully durable.

19. The DSN of claim 18, wherein the protocol message includes:
- a versioned slice name of a dispersal encoded data slice associated with the particular revision of source data; and
- information instructing the DSN memory to transmit an acknowledgement message to the DS processing unit indicating that the particular revision of source data has been flushed to persistent storage.

20. The DSN of claim 19, wherein the protocol message further includes:
- information instructing the DSN memory to remove data slices associated with other revisions of the source data, wherein the other revisions have been stored in a cache memory.

* * * * *